US012700840B2

(12) United States Patent
Pattipaka et al.

(10) Patent No.: US 12,700,840 B2
(45) Date of Patent: Aug. 4, 2026

(54) LOW SECOND HARMONIC SINGLE ENDED CLASS AB AMPLIFIER

(71) Applicant: TEXAS INSTRUMENTS INCORPORATED, Dallas, TX (US)

(72) Inventors: Ravikumar Pattipaka, Bangalore (IN); Raja Sekhar, Bangalore (IN); Sandeep Kesrimal Oswal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 581 days.

(21) Appl. No.: 18/175,785

(22) Filed: Feb. 28, 2023

(65) Prior Publication Data

US 2024/0291451 A1    Aug. 29, 2024

(51) Int. Cl.
H03F 1/26       (2006.01)
H03F 3/21       (2006.01)
H03F 3/45       (2006.01)

(52) U.S. Cl.
CPC ........... H03F 3/45076 (2013.01); H03F 1/26 (2013.01); H03F 3/211 (2013.01)

(58) Field of Classification Search
CPC .. H03F 3/45076; H03F 3/211; H03F 3/45219; H03F 3/45475; H03F 3/3022; H03F 1/26; H03F 1/02; H03F 3/45
USPC ............................................ 330/9, 252–261
See application file for complete search history.

(56) References Cited

U.S. PATENT DOCUMENTS

| | | | |
|---|---|---|---|
| 7,405,622 B2 * | 7/2008 | Nishimura ............ | H03F 3/3022 |
| | | | 330/255 |
| 8,363,045 B2 * | 1/2013 | Shimatani ........... | H03F 3/45192 |
| | | | 330/257 |
| 10,170,992 B1 * | 1/2019 | Omole .................. | H02M 3/156 |
| 2009/0146738 A1 * | 6/2009 | Chang ................... | H03F 3/3022 |
| | | | 330/255 |
| 2011/0007058 A1 * | 1/2011 | Hisano ................ | H03F 3/45219 |
| | | | 330/253 |

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

In an example, a circuit includes a high side output transistor having a control terminal coupled to a first capacitor, and includes a low side output transistor having a control terminal coupled to a second capacitor and a balancing capacitor. The circuit includes a first differential input stage configured to receive a differential input and provide a first output current to the control terminal of the high side output transistor. The circuit includes a second differential input stage configured to receive the differential input and provide a second output current to the control terminal of the low side output transistor. The circuit includes a floating battery coupled to the control terminal of the high side output transistor and the control terminal of the low side output transistor. The balancing capacitor balances a gate-to-source capacitance of the low side output transistor with a gate-to-source capacitance of the high side output transistor.

20 Claims, 5 Drawing Sheets

500

LOW SECOND HARMONIC SINGLE ENDED CLASS AB AMPLIFIER

BACKGROUND

A transducer is an electronic device that converts energy from one form to another. An ultrasound transducer may convert electrical signals to sound signals during a transmit phase, and convert sound signals to electrical signals during a receive phase. A receiver processes the electrical signal received from the transducer, where the electrical signal is proportional to the sound signal received by the transducer. The electrical signal may be amplified for further processing.

SUMMARY

In accordance with at least one example of the disclosure, a circuit includes a first differential input stage having a first positive input terminal coupled to a control terminal of a first transistor, and having a first negative input terminal coupled to a control terminal of a second transistor. The circuit includes a second differential input stage including a second positive input terminal coupled to a control terminal of a third transistor, and a second negative input terminal coupled to a control terminal of a fourth transistor. The circuit includes a floating battery including a fifth transistor and a sixth transistor, the floating battery coupled to the second transistor and the fourth transistor. The circuit includes an output stage, the output stage having a high side output transistor having a control terminal coupled to the first differential input stage and the floating battery. The output stage includes a low side output transistor having a control terminal coupled to the second differential input stage and the floating battery. The output stage includes a first compensation capacitor coupled to the floating battery and a second compensation capacitor coupled to the floating battery.

In accordance with at least one example of the disclosure, a circuit includes a high side output transistor having a control terminal coupled to a first capacitor. The circuit includes a low side output transistor having a control terminal coupled to a second capacitor and to a balancing capacitor. The circuit also includes a first differential input stage configured to receive a differential input and provide a first output current to the control terminal of the high side output transistor. The circuit includes a second differential input stage configured to receive the differential input and provide a second output current to the control terminal of the low side output transistor. The circuit also includes a floating battery coupled to the control terminal of the high side output transistor and the control terminal of the low side output transistor. The balancing capacitor is configured to balance a gate-to-source capacitance of the low side output transistor with a gate-to-source capacitance of the high side output transistor.

In accordance with at least one example of the disclosure, a system includes a transducer. The system also includes a transconductance amplifier having an input coupled to an output of the transducer. The system includes an operational amplifier having an input coupled to an output of the transconductance amplifier. The operational amplifier includes a first differential input stage and a second differential input stage having a balancing capacitor. The operational amplifier also includes a floating battery coupled to the first differential input stage and the second differential input stage. The operational amplifier includes an output stage. The output stage includes a high side output transistor having a control terminal coupled to the first differential input stage and the floating battery. The output stage also includes a low side output transistor having a control terminal coupled to the second differential input stage and the floating battery. The output stage includes a first compensation capacitor coupled to the floating battery and a second compensation capacitor coupled to the floating battery.

BRIEF DESCRIPTION OF THE DRAWINGS

The same reference numbers or other reference designators are used in the drawings to designate the same or similar (functionally and/or structurally) features.

DETAILED DESCRIPTION

A transducer receives a signal and converts it to an electrical signal. To process the electrical signal, circuitry amplifies the received electrical signal. The received signal at the transducer may be 50 millivolts (mV) peak to peak, and the signal is amplified to a higher value, such as 1 volt (V) peak to peak for processing. Amplification provides a better signal to noise ratio (SNR) for the signal. A voltage across the transducer is first converted to a current using a transconductance amplifier. The current is then converted to a voltage with a resistor and an operational amplifier (op-amp). The gain of the amplifier is increased to provide a suitable amplification for the signal. However, a high bandwidth amplifier with high gain consumes high power. Another approach to implement a high gain operational amplifier is to cascade multiple gain stages. However, multiple gain stages introduce stability problems, and can cause gain peaking at certain frequencies.

The op-amp has a differential input stage with plus and minus input terminals. The input stage responds only to the difference in the input signals and provides good common mode rejection. The op-amp also has a class AB output stage that provides an output with a low quiescent current. A floating battery that includes two transistors biases the output class AB transistors in the op-amp if no differential input signal is present at the input stage. The floating battery biases the output transistors in the op-amp so they may respond quickly when a differential input signal is received at the input stage. Currents flow through the floating battery during the positive half-cycle and the negative half-cycle of the class AB output signal. However, these currents are asymmetric, and the asymmetry causes second harmonic distortion.

In examples herein, the op-amp includes circuitry that reduces the second harmonic distortion described above. The op-amp includes two differential input stages, one coupled to a high side transistor in the class AB output stage and the other coupled to a low side transistor in the class AB output stage. The differential input stages each receive the same input signal. The op-amp also includes the floating battery and a balancing capacitor. The balancing capacitor is sized to make the gate-to-source current from the low side transistor in the output stage approximately equal to the gate-to-source current from the high side transistor in the output stage. By making these currents approximately equal, the currents during the positive half-cycle and the negative half-cycle are also approximately equal, which reduces the second harmonic distortion caused by asymmetric currents as described above. In some examples, the balancing capacitor is optional.

Figure 1:
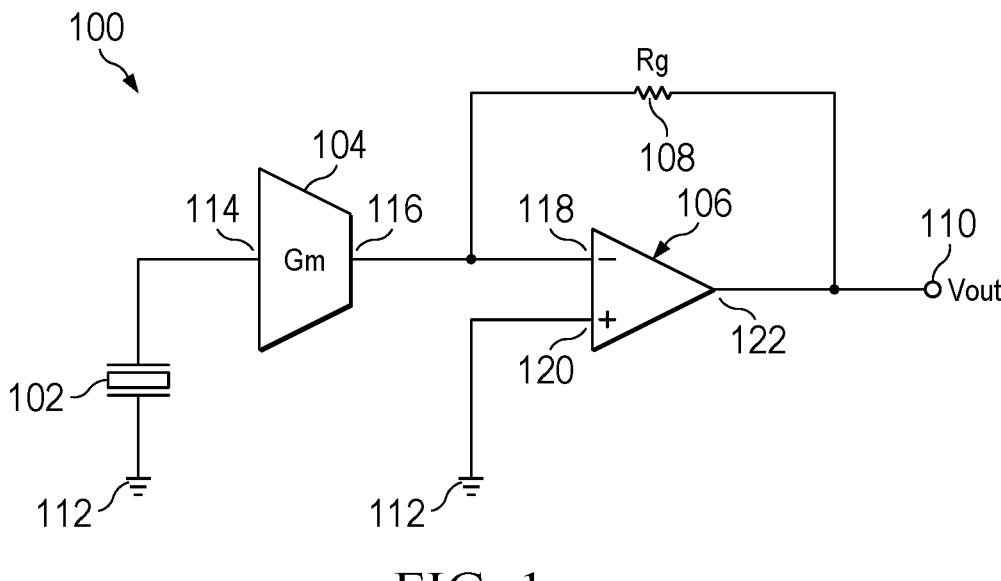
FIG. 1 is a circuit diagram of a system for amplifying a transducer signal in accordance with various examples.

FIG. 1 is a circuit diagram of a system 100 for amplifying a transducer signal in accordance with various examples herein. System 100 includes a transducer 102, a transconductance amplifier (Gm) 104, an op-amp 106, a resistor Rg 108, and an output node 110 that produces a voltage $V_{OUT}$. Transducer 102 is coupled to ground 112 and to input 114 of transconductance amplifier 104. Transconductance amplifier 104 has an output 116 coupled to a first input 118 of op-amp 106. A second input 120 of op-amp 106 is coupled to ground 112. Op-amp 106 has an output 122 coupled to output node 110. Resistor Rg 108 is coupled between input 118 and output 122 of op-amp 106.

In an example operation, the transducer 102 receives an input signal (such as a sound signal) and provides a voltage to transconductance amplifier 104, where the voltage is responsive to the input signal. Transconductance amplifier 104 receives a voltage from transducer 102 and provides a current to op-amp 106. Op-amp 106 converts the current to a voltage with resistor Rg 108. The overall gain of the signal is in system 100 is the gain of the transconductance amplifier 104 (Gm) multiplied by the resistor Rg 108. In examples herein, op-amp 106 includes two differential input stages, one coupled to a high side transistor in the class AB output stage and the other coupled to a low side transistor in the class AB output stage. The differential input stages each receive the same input signal. The op-amp also includes the floating battery and a balancing capacitor. The differential input stages, the class AB output stage, the floating battery, the balancing capacitor, and their operation are described with respect to FIG. 2 below. In this example, op-amp 106 provides improved second harmonic distortion by balancing currents in op-amp 106.

Figure 2:
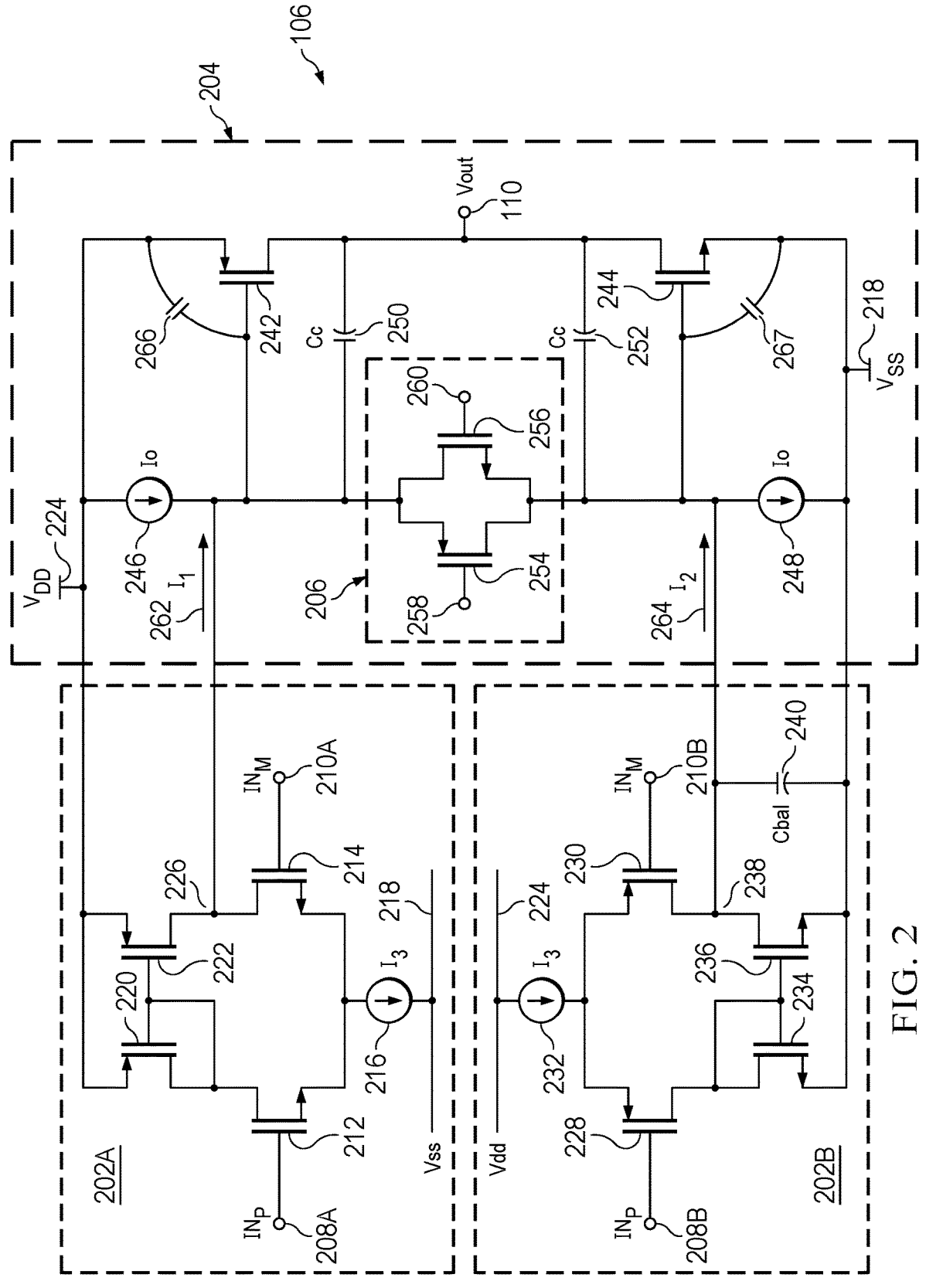
FIG. 2 is a circuit diagram of an op-amp with two differential input stages and a balancing capacitor in accordance with various examples.

FIG. 2 is a circuit diagram of an op-amp 106 with two differential input stages and a balancing capacitor in accordance with various examples herein. Op-amp 106 includes two differential input stages 202A and 202B (collectively, differential input stages 202 or individually, a differential input stage 202). Op-amp 106 also includes an output stage 204. Output stage 204 is a class AB output stage in this example. Output stage 204 includes floating battery 206.

Differential input stage 202A includes differential inputs Inp 208A and Inm 210B. Inp 208A is the plus (p or positive) input, and Inm 210A is the minus (m or negative) input. Inp 208A is coupled to a gate or control terminal of transistor 212. Inm 210A is coupled to a gate or control terminal of transistor 214. A source of transistor 212 and a source of transistor 214 are coupled to a current source 216 that provides a bias current I3 for differential input stage 202A. Current source 216 is coupled to a voltage 218 that provides a voltage $V_{SS}$. Voltage 218 may be provided by any suitable voltage source or supply. $V_{SS}$ may be ground in one example. Transistors 220 and 222 make up a current mirror that provides current to transistors 212 and 214. A drain of transistor 212 and a drain of transistor 214 are coupled to the current mirror of transistors 220 and 222. A gate (or control terminal) of transistor 220 is coupled to a gate (or control terminal) of transistor 222 and to a drain of transistor 220.

A source of transistor 220 and a source of transistor 222 are coupled to a voltage 224 that provides a voltage $V_{DD}$. Voltage 224 may be provided by any suitable voltage source or supply. A drain of transistor 222 is coupled to a drain of transistor 214 at node 226. The output of differential input stage 202A is provided at node 226. In one example, transistors 212 and 214 are n-type transistors, and transistors 220 and 222 are p-type transistors.

Differential input stage 202B includes differential inputs Inp 208B and Inm 210B. Inp 208B is the plus (p) input, and Inm 210B is the minus (m) input. Inp 208B is coupled to a gate or control terminal of transistor 228. Inm 210B is coupled to a gate or control terminal of transistor 230. A source of transistor 228 and a source of transistor 230 are coupled to a current source 232 that provides a bias current I3 for differential input stage 202B. The current provided by current source 232 is the same as the current provided by current source 216 in one example. Current source 232 is coupled to a voltage 224 that provides a voltage $V_{DD}$. Transistors 234 and 236 make up a current mirror that provides current to transistors 228 and 230. A drain of transistor 228 and a drain of transistor 230 are coupled to the current mirror of transistors 234 and 236. A gate (or control terminal) of transistor 234 is coupled to a gate (or control terminal) of transistor 236 and to a drain of transistor 234. A source of transistor 234 and a source of transistor 236 are coupled to a voltage 218 that provides a voltage $V_{SS}$ (which may be ground in an example). A drain of transistor 236 is coupled to a drain of transistor 230 at node 238. The output of differential input stage 202B is provided at node 238. Differential input stage 202B also includes a balancing capacitor (Cbal) 240. In other examples, the balancing capacitor 240 may be absent.

Differential input stages 202 provide one example of circuitry for providing a differential input for op-amp 106. However, in other examples, the internal circuitry of differential input stages 202 may be different than the example provided herein. Current sources, current mirrors, and voltage sources may include any suitable circuitry. While some examples herein use field effect transistors (FETs), any types of transistors may be useful in other examples.

Differential input stages 202A and 202B are each coupled to output stage 204 that includes floating battery 206. Output stage 204 is a class AB output stage in this example, which provides an output at output node 110 where the voltage can swing from $V_{DD}$ to $V_{SS}$ and from $V_{SS}$ to $V_{DD}$. Class AB operation includes a positive half-cycle and a negative half-cycle at the output node 110. Output stage 204 includes a high side output transistor 242 (e.g., transistor 242) and a low side output transistor 244 (e.g., transistor 244). Output stage 204 also includes a current source 246 and a current source 248. Current sources 246 and 248 each produce a current Io for biasing transistors 242 and 244, respectively. Output stage 204 also includes a compensation capacitor (Cc) 250 and a compensation capacitor 252. Floating battery includes a transistor 254 and a transistor 256.

In output stage 204, a gate (or control terminal) of transistor 242 is coupled to current source 246 and to node 226. A source of transistor 242 is coupled to voltage 224. A drain of transistor 242 is coupled to output node 110 and to a drain of transistor 244. Compensation capacitor 250 is coupled between a gate and a drain of transistor 242. The gate of transistor 242 is also coupled to floating battery 206. In one example, transistor 242 is a p-channel transistor.

In output stage 204, a gate (or control terminal) of transistor 244 is coupled to current source 248 and to node 238. A source of transistor 244 is coupled to voltage 218. A drain of transistor 244 is coupled to output node 110 and to a drain of transistor 242. Compensation capacitor 252 is coupled between a gate and a drain of transistor 244. The gate of transistor 244 is also coupled to floating battery 206. In one example, transistor 244 is an n-channel transistor.

Floating battery 206 includes transistor 254 and 256 in this example. Transistor 254 has a source coupled to the drain of transistor 256. Transistor 256 has a source coupled to the drain of transistor 254. A gate of transistor 254 is coupled to a node 258 that provides a bias voltage for transistor 254. A gate of transistor 256 is coupled to a node 260 that provides a bias voltage for transistor 256.

If a differential input signal is provided to the inputs of differential input stages 202, each differential input stage 202 provides a current to output stage 204. Differential input stage 202A provides a current I1 262 to the gate of transistor 242, and differential input stage 202B provides a current I2 264 to the gate of transistor 242. Because the differential input stages 202 are similar, current I1 262 equals current I2 264. The combination of current I1 262 and current I2 264 provide the full load current, so current I1 262 and current I2 264 are each ½ of the load current provided at output node 110.

Op-amp 106 also includes a gate-to-source capacitance Cgsp 266, which represents the capacitance across the gate to source of transistor 242. Op-amp 106 includes a gate-to-source capacitance Cgsn 267, which represents the capacitance across the gate to source of transistor 244.

In operation, floating battery 206 provides bias for the transistors in op-amp 106. Floating battery 206 ensures the current through transistors 242 and 244 is a minimum value if there is no differential input signal at the inputs of the differential input stages 202. Therefore, floating battery 206 ensures there is some current flowing through the transistors in the op-amp 106 if there is no input signal. Without floating battery 206, the transistor in op-amp 106 may take too long to turn on when a differential input signal occurs.

In a system with only one differential input stage, current flows from the high side transistor (e.g., transistor 242) to the load at output node 110. The voltage at the gate of high side transistor rises to source the output current. This rising voltage turns off transistor 254 in floating battery 206 by reducing the gate-to-source voltage of transistor 254. Transistor 256 is on at this time. Some current flows through compensation capacitor 250 back to node 226. Also, current flows through compensation capacitor 252, through transistor 256, and to node 226. The voltage at the gate of transistor 244 rises so transistor 256 can carry this current. A rising voltage at the gate of transistor 244 causes a gate-to-source voltage to occur across transistor 244 (if $V_{SS}$ is at ground), so current flows through transistor 244. The voltage swing at the gate of transistor 244 is a function of the current through compensation capacitor 250.

An opposite situation occurs during the negative half cycle in a system with only one differential input stage. The low side transistor 244 sinks current from a load coupled to output node 110 by the gate of transistor 244 rising. Transistor 256 in floating battery 206 turns off, and transistor 254 is on. Transistor 254 carries current from low side transistor 244 through compensation capacitor 252 to node 226. The voltage at the gate of transistor 242 rises. The voltage swing at the gate of transistor 242 is a function of the current through compensation capacitor 252 and the current through Cgsn 267.

As described above, in the system with only one differential input stage, the currents are different during the positive half cycle than during the negative half cycle.

During the positive half cycle, the voltage swing at the gate of transistor 244 is a function of the current through compensation capacitor 250. During the negative half cycle, the voltage swing at the gate of transistor 242 is a function of the current through compensation capacitor 252 and the current through Cgsn 267. Because one of these values is a function of the Cgsn 267 current while the other is not, an imbalance is created between the positive and the negative half cycles. This imbalance creates second harmonic distortion.

The examples described herein have two differential input stages 202 and a balancing capacitor 240. With two differential input stages 202 and a balancing capacitor 240, the currents during the positive half cycle and the negative half cycle are balanced.

In the positive half cycle, one-half of the current through Cgsp 266 flows back to node 226 (in the opposite direction of I1 262) and one-half of the current flows through floating battery 206 (through transistor 256), and then to node 238 (in the opposite direction of I2 264). The current through compensation capacitor 250 flows to node 226. The current through compensation capacitor 252 flows to node 238. Therefore, in contrast to the system with only one differential input stage, in this example none of the current through either compensation capacitor 250 or compensation capacitor 252 flows through floating battery 206.

In the negative half cycle, one-half of the current through Cgsn 267 flows back to node 238 (in the opposite direction of I2 264) and one-half of the current flows through floating battery 206 (through transistor 254), and then to node 226 (in the opposite direction of I1 262). Because the currents are the same in the positive half-cycle as in the negative half-cycle, second harmonic distortion is reduced.

Balancing capacitor 240 is added so the gate-to-source capacitance across transistor 242 is equal to the gate-to-source capacitance across transistor 244. In an example, if transistor 242 is a p-channel transistor and transistor 244 is an n-channel transistor, transistor 242 may be sized larger than transistor 244 to provide a similar amount of current during class AB operation of output stage 204. A larger transistor 242 means that transistor 242 has a larger gate-to-source capacitance than transistor 244 (e.g., Cgsp>Cgsn). Therefore, balancing capacitor 240 is added to Cgsn 267 so both gate-to-source capacitances are equal. In other examples, balancing capacitor 240 may be absent.

In one example herein, second harmonic distortion may be improved by 19 decibels (dB) for a given quiescent current compared to a system with only one differential input stage. Similar bandwidth, amplifier gain, and power may be achieved with lower second harmonic distortion.

Figure 3:
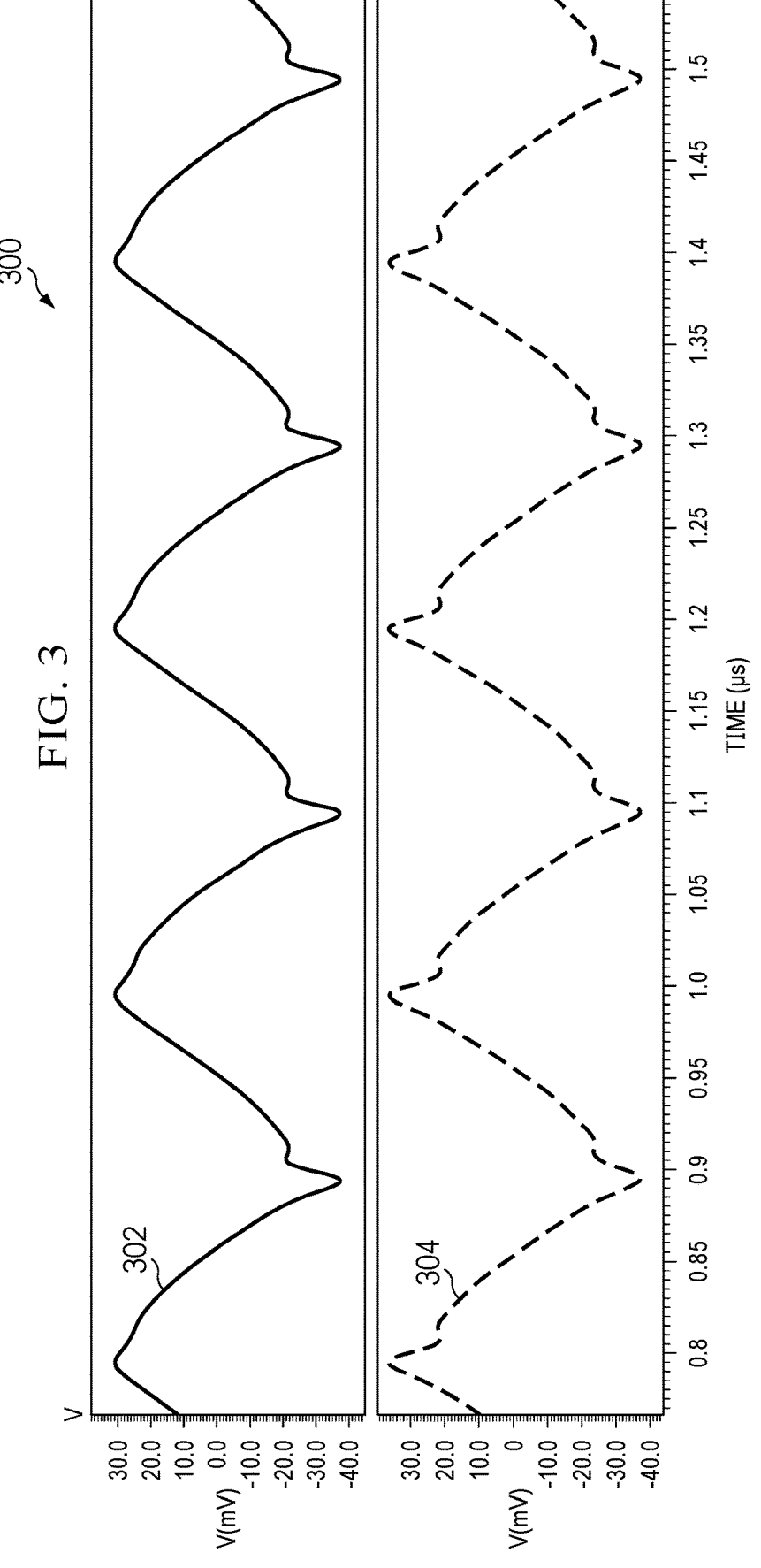
FIG. 3 is a graph of a differential input signal in accordance with various examples.

FIG. 3 is a graph 300 of a differential input signal in accordance with various examples herein. Graph 300 has a y-axis that indicates voltage in millivolts and an x-axis that indicates time in microseconds. Curve 302 shows a system with one differential input stage, and curve 304 shows a system with two differential input stages and a balancing capacitor as described herein. As shown in FIG. 3, curve 304 exhibits much greater symmetry than curve 302.

Figure 4:
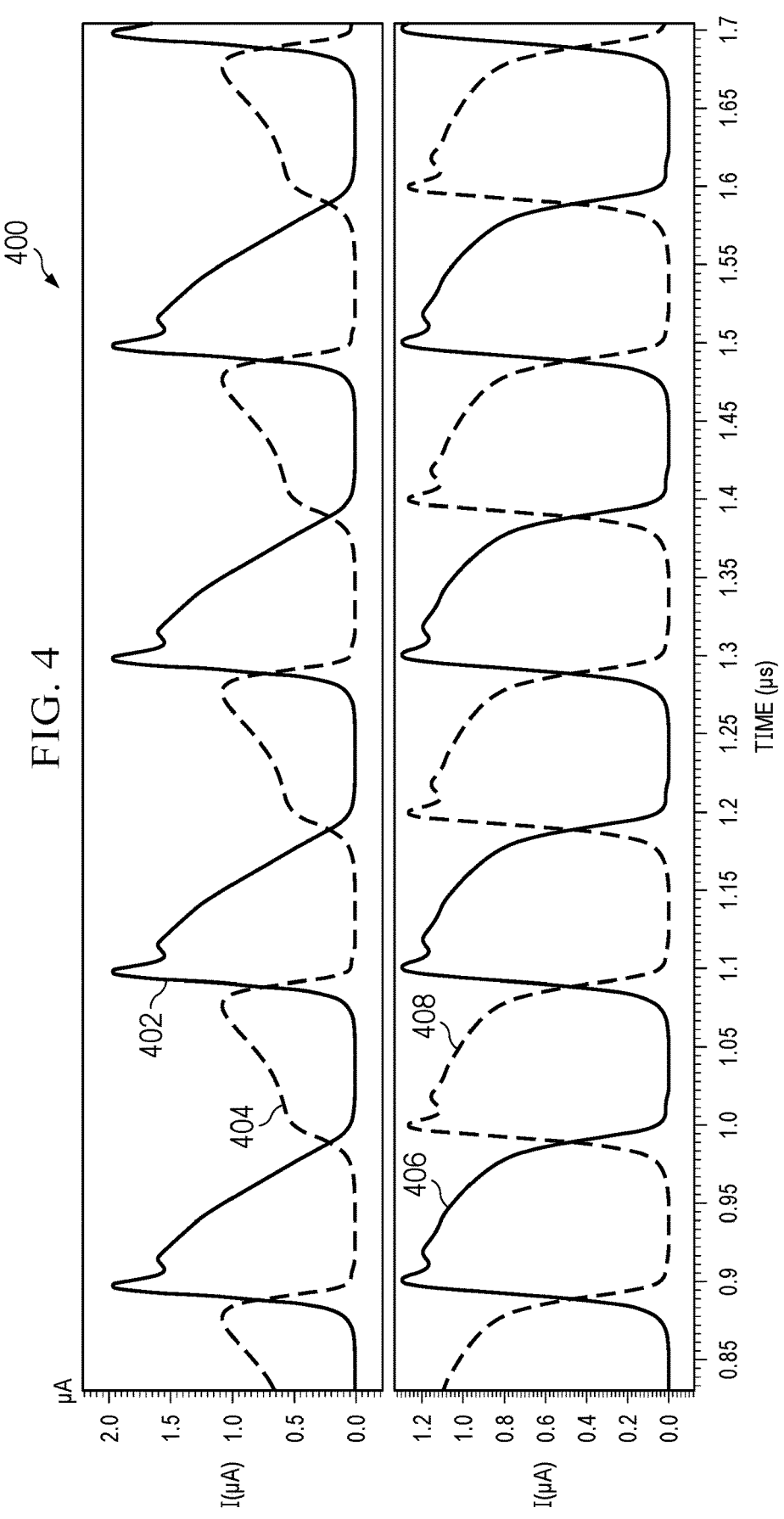
FIG. 4 is a graph of currents through a floating battery in accordance with various examples.

FIG. 4 is a graph 400 of currents through floating battery 206 in accordance with various examples herein. Graph 400 has a y-axis that indicates current in microamps and an x-axis that indicates time in microseconds. Curves 402 and 404 show a system with one differential input stage, and curves 406 and 408 show a system with two differential input stages and a balancing capacitor as described herein.

Curve 402 indicates a current through a p-channel transistor in a floating battery, and curve 404 indicates a current through an n-channel transistor in a floating battery. In this system, the currents are asymmetrical and curve 402 indicates a high peak current, up to 2.0 microamps.

Curves 406 and 408 provide more symmetry compared to the one differential input stage system. In the system with two differential input stages and a balancing capacitor, curve 406 indicates a current through a p-channel transistor in floating battery 206, and curve 408 indicates a current through an n-channel transistor in floating battery 206. The currents are symmetrical in this example and do not exhibit the high peak current shown in curve 402.

Figure 5:
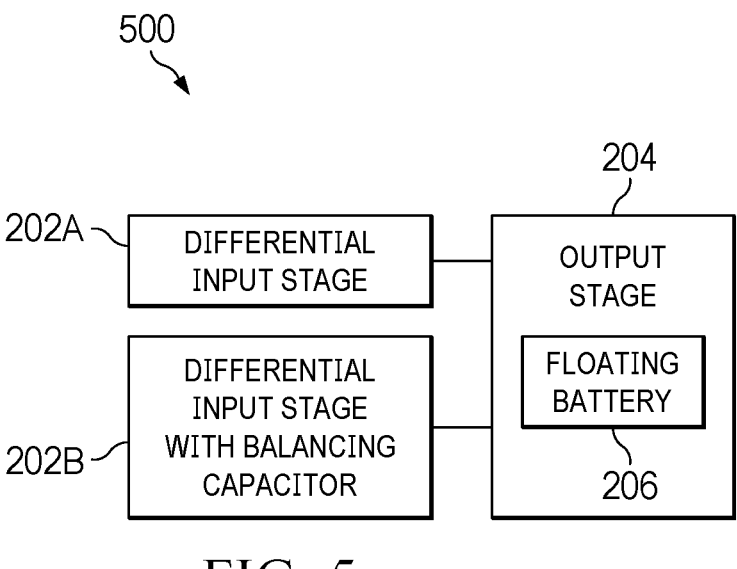
FIG. 5 is a block diagram of an op-amp in accordance with various examples.

FIG. 5 is a block diagram of an op-amp 500 in accordance with various examples herein. In this example, op-amp 500 includes a first differential input stage 202A. Op-amp 500 includes a second differential input stage with balancing capacitor 202B. The differential input stages 202A and 202B are described above with respect to FIG. 2. The differential input stages 202 may include any suitable hardware, circuitry, or digital logic to perform the examples described herein.

Op-amp 500 includes output stage 204 and floating battery 206. Output stage 204 and floating battery 206 may include any suitable hardware, circuitry, or digital logic to perform the examples described herein. In one example, output stage 204 is a class AB output stage that provides an output with low quiescent current and high signal current, and wherein the voltage can swing from $V_{DD}$ to $V_{SS}$ and from $V_{SS}$ to $V_{DD}$. Output stage 204 may be compensated using compensation capacitors in one example. Floating battery 206 is configured to provide bias currents to transistors in op-amp 500 in the absence of a differential input signal.

In examples herein, second harmonic distortion may be reduced without a noise penalty or extra power consumption via an op-amp with a pair of differential input stages. The differential input stages receive the same input signal and are coupled to either end of a floating battery. One of the differential input stages includes a balancing capacitor for balancing gate-to-source voltages, currents, or capacitances of transistors in an output stage. The systems described herein reduce second harmonic distortion caused by the floating battery by equalizing currents for both the positive half-cycles and the negative half-cycles of the op-amp. The absolute values of the currents flowing through the floating battery are reduced in examples herein, which improves the mismatch-related second harmonic distortion.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit, comprising:
a first differential input stage including:
    a first positive input terminal coupled to a control terminal of a first transistor, and
    a first negative input terminal coupled to a control terminal of a second transistor;
a second differential input stage including:
    a second positive input terminal coupled to a control terminal of a third transistor;
    a second negative input terminal coupled to a control terminal of a fourth transistor; and
    a balancing capacitor;
a floating battery including a fifth transistor and a sixth transistor, the floating battery coupled to the second transistor and the fourth transistor;
an output stage including:
    a high side output transistor having a control terminal coupled to the first differential input stage and the floating battery;
    a low side output transistor having a control terminal coupled to the second differential input stage, the floating battery, and the balancing capacitor;
    a first compensation capacitor coupled to the floating battery; and a second compensation capacitor coupled to the floating battery.

2. The circuit of claim 1, wherein the first differential input stage includes a current mirror coupled to a drain of the first transistor and a drain of the second transistor, and wherein the drain of the second transistor is coupled to the control terminal of the high side output transistor.

3. The circuit of claim 1, wherein the first compensation capacitor has a first terminal coupled to the control terminal of the high side output transistor and a second terminal coupled to a drain of the high side output transistor.

4. The circuit of claim 1, wherein the second compensation capacitor has a first terminal coupled to the control terminal of the low side output transistor and a second terminal coupled to a drain of the low side output transistor.

5. The circuit of claim 1, wherein the balancing capacitor has a first terminal coupled to the control terminal of the low side output transistor and a second terminal coupled to a source of the low side output transistor.

6. The circuit of claim 1, wherein the high side output transistor and the low side output transistor are configured as a class AB output stage.

7. The circuit of claim 1, wherein the output stage includes a current source coupled to a voltage source and to the control terminal of the high side output transistor.

8. The circuit of claim 1, wherein the first differential input stage includes a current source coupled to a source of the first transistor and a source of the second transistor.

9. The circuit of claim 1, wherein the fifth transistor has a source coupled to a drain of the sixth transistor, and the fifth transistor has a drain coupled to a source of the sixth transistor.

10. A circuit, comprising:

a high side output transistor having a control terminal coupled to a first capacitor;

a low side output transistor having a control terminal coupled to a second capacitor and to a balancing capacitor;

a first differential input stage configured to receive a differential input and provide a first output current to the control terminal of the high side output transistor;

a second differential input stage configured to receive the differential input and provide a second output current to the control terminal of the low side output transistor;

a floating battery coupled to the control terminal of the high side output transistor and the control terminal of the low side output transistor; and wherein the balancing capacitor is configured to balance a gate-to-source capacitance of the low side output transistor with a gate-to-source capacitance of the high side output transistor.

11. The circuit of claim 10, wherein the floating battery is configured to bias the high side output transistor and the low side output transistor.

12. The circuit of claim 10, wherein a current through the floating battery is the same for a positive half cycle of an output voltage and a negative half cycle of the output voltage.

13. The circuit of claim 10, wherein the first differential input stage includes a first positive input terminal coupled to a control terminal of a first transistor, and a first negative input terminal coupled to a control terminal of a second transistor.

14. The circuit of claim 10, wherein the first output current equals the second output current.

15. The circuit of claim 10, wherein the first differential input stage includes a first transistor and a second transistor, a source of the first transistor coupled to a source of the second transistor, and a current mirror coupled to a drain of the first transistor and a drain of the second transistor.

16. The circuit of claim 10, wherein the floating battery includes a first transistor and a second transistor, wherein the first transistor has a source coupled to a drain of the second transistor, and the first transistor has a drain coupled to a source of the second transistor.

17. The circuit of claim 10, wherein the high side output transistor and the low side output transistor are configured as a class AB output stage.

18. The circuit of claim 10, further comprising a current source coupled to the control terminal of the high side output transistor and to a voltage source.

19. A system, comprising:

a transducer;

a transconductance amplifier having an input coupled to an output of the transducer;

an operational amplifier having an input coupled to an output of the transconductance amplifier, the operational amplifier including:

a first differential input stage;

a second differential input stage having a balancing capacitor;

a floating battery coupled to the first differential input stage and the second differential input stage;

an output stage including:

a high side output transistor having a control terminal coupled to the first differential input stage and the floating battery;

a low side output transistor having a control terminal coupled to the second differential input stage and the floating battery;

a first compensation capacitor coupled to the floating battery; and a second compensation capacitor coupled to the floating battery.

20. The system of claim 19, wherein the balancing capacitor is configured to balance a gate-to-source capacitance of the low side output transistor with a gate-to-source capacitance of the high side output transistor.

* * * * *